US005745734A

United States Patent [19]
Craft et al.

[11] Patent Number: 5,745,734
[45] Date of Patent: Apr. 28, 1998

[54] METHOD AND SYSTEM FOR PROGRAMMING A GATE ARRAY USING A COMPRESSED CONFIGURATION BIT STREAM

[75] Inventors: David John Craft, Austin, Tex.; Scott Whitney Gould, So. Burlington, Vt.; Frank Ray Keyser, III, Colchester, Vt.; Brian Worth, Milton, Vt.

[73] Assignee: International Business Machines Corporation, Armonk, N.Y.

[21] Appl. No.: 536,901

[22] Filed: Sep. 29, 1995

[51] Int. Cl.⁶ .................................................. H03M 7/46
[52] U.S. Cl. .......................... 395/500; 364/578; 326/39; 341/55; 341/106
[58] Field of Search .......................... 326/38, 39; 341/55, 341/106; 371/22.2; 364/578, 488–489, 490, 491; 395/500

[56] References Cited

U.S. PATENT DOCUMENTS

| | | | |
|---|---|---|---|
| 5,155,484 | 10/1992 | Chambers | 341/55 |
| 5,315,178 | 5/1994 | Snider | 307/465 |
| 5,329,179 | 7/1994 | Tang et al. | 307/465 |
| 5,336,950 | 8/1994 | Popli et al. | 307/465 |
| 5,394,031 | 2/1995 | Britton et al. | 326/38 |
| 5,410,671 | 4/1995 | Elgamal | 395/425 |
| 5,430,687 | 7/1995 | Hung | 365/230 |
| 5,440,718 | 8/1995 | Kumagai | 395/481 |
| 5,563,592 | 10/1996 | Cliff | 341/63 |
| 5,563,595 | 10/1996 | Strohacker | 341/106 |
| 5,572,209 | 11/1996 | Farmer | 341/67 |
| 5,581,198 | 12/1996 | Trimberger | 326/38 |
| 5,608,396 | 3/1997 | Cheng | 341/50 |

OTHER PUBLICATIONS

Atmel Corporation, "Application Note AT6000 Series Configuration," May 1993, Atmel Corporation, 1–14, 16.

*Primary Examiner*—Kevin J. Teska
*Assistant Examiner*—A. S. Roberts
*Attorney, Agent, or Firm*—Heslin & Rothenberg, P.C.

[57] ABSTRACT

A generalized data decompression engine is incorporated within a field programmable gate array ("FPGA"). The generalized data decompression engine uses a general purpose data decompression technique such as, for example, a Lempel-Ziv type technique. During operation, a compressed configuration bit stream is received by the generalized data decompression engine in the FPGA and is decompressed thereby. A resultant decompressed configuration bit stream is then used to program logic cells within the FPGA.

39 Claims, 7 Drawing Sheets

METHOD AND SYSTEM FOR PROGRAMMING A GATE ARRAY USING A COMPRESSED CONFIGURATION BIT STREAM

RELATED APPLICATION INFORMATION

This application relates to commonly owned previously filed U.S. Patent Applications:

1. Ser. No. 08/459,579, entitled "PROGRAMMABLE ARRAY INTERCONNECT NETWORK," filed Jun. 2, 1995;

2. Ser. No. 08/460,420, entitled "PROGRAMMABLE ARRAY I/O—ROUTING RESOURCE," filed Jun. 2, 1995;

3. Ser. No. 08/460,481, entitled "PROGRAMMABLE LOGIC CELL," filed Jun. 2, 1995.

4. Ser. No. 08/459,156, entitled "PROGRAMMABLE ARRAY CLOCK/RESET RESOURCE," filed Jun. 2, 1995.

The section entitled "Description of the Preferred Embodiment(s)," and the drawings, from each of the above-referenced related U.S. Patent applications are hereby expressly incorporated herein by reference.

TECHNICAL FIELD

This invention relates in general to programmable integrated circuit devices. More particularly, the present invention relates to a method and system for programming a gate array using a compressed bit stream.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function comprising the sum of the products of the input terms can thus be calculated. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), in which the configuration of the cells and the wiring network occurs when adding the final layers of metallization to an integrated circuit. A modified approach involves the use of laser-directed energy to customize the metallization pattern. Another such array is a Field Programmable Gate Array ("FPGA") in which the configuration can be performed by a user, in the "field." Such configuration may be effected by using electrically programmable fusible links, antifuses, memory-controlled transistors, or floating-gate transistors.

Figure 1:
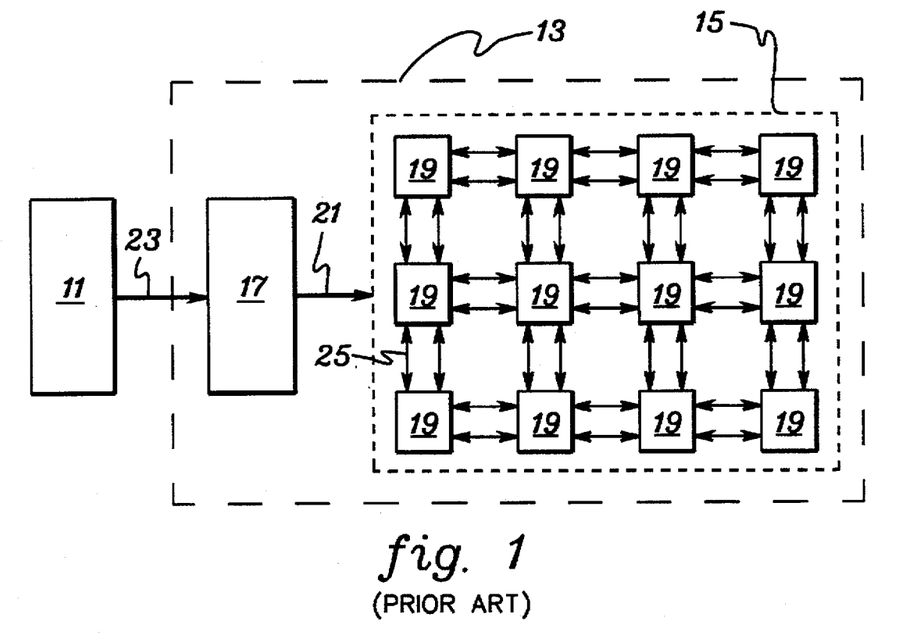
FIG. 1 is a diagram of a conventional FPGA connected to an external ROM containing configuration data.

In an implementation of an FPGA using, for example, Static Random Access Memory ("SRAM") cells to hold configuration information, at system power-up/initialization the FPGA reads in the configuration information to the SRAM cells from an external source. More specifically, as shown in FIG. 1, a state machine 17 within an FPGA 13 reads a parallel or sequential configuration bit stream from a Read Only Memory ("ROM") 11 external to FPGA 13. The programming bit stream is read into the FPGA over data path 23 and is appropriately directed to individual programming cells of each logic cell 19 within the FPGA over data path 21. As is well known, FPGAs contain an array 15 of logic cells 19 interconnected by horizontal and vertical interconnects 25.

As the number of programmable elements in an FPGA increases, the amount of programming information necessary to configure the FPGA increases as well. For example, as the number of logic cells of an FPGA increases, additional configuration information is required. This increases the size of, for example, ROM 11 required to hold the configuration information. Thus, larger, more expensive ROMs (or other storage devices such as, for example, Erasable Programmable Read Only Memories—"EPROMS" or Electrically Erasable Programmable Read Only Memories—"EEPROMs") are required for configuring larger FPGAs within a system.

Increased configuration information requires increased time to transfer to the FPGA. ROM 11 transfers the configuration bit stream to state machine 17 at a predetermined bit rate. If there are more bits to send (i.e., a larger configuration), a longer transfer time is necessary. In volatile store type FPGAs using, for example, a Static Random Access Memory ("SRAM") configuration, the long configuration transfer time is required each time the FPGA is powered up and initialized.

The present invention is directed toward solving the above-noted problems.

SUMMARY OF THE INVENTION

In a first aspect, the present invention includes a programmable logic circuit comprising multiple programmable logic cells, a configuration input and a generalized data decompression engine. The generalized data decompression engine has a compressed input and a decompressed output, wherein the compressed input is coupled to the configuration input and the decompressed output is coupled to the multiple programmable logic cells to provide programming thereof. The generalized data decompression engine may comprise, for example, a Lempel-Ziv type decompression engine.

As an enhancement, the programmable logic circuit may include a configuration memory for storing a configuration of the multiple programmable logic cells. The configuration memory also comprises a history buffer for the generalized data decompression engine. Moreover, the generalized data decompression engine may include means for copying data from an already loaded portion of the configuration memory to another portion of the configuration memory.

Specifically, the means-for copying may include a read address register for storing an address of the configuration memory from which data is to be copied. A write address register may store an address of the configuration memory to which data is to be written. The programmable logic circuit may include an arithmetic logic unit ("ALU") having two inputs. A first input is coupled to the write address register, while a second input is coupled to the compressed input of the generalized data decompression engine. An output of the ALU is coupled to the read address register for storing therein an address as an arithmetic function of the first input and the second input.

As further enhancements, the read address register and the write address register may comprise shift registers. The arithmetic logic unit may then comprise a one bit serial arithmetic logic unit wherein the first input, the second input, and the output are each one bit wide.

As yet another enhancement, the programmable logic circuit may include a parallel to serial converter that includes a parallel address output, a parallel data input and a serial data output. The serial data output is coupled to the serial data input of the generalized data decompression engine, and the parallel address output and the parallel data input are adapted to couple to a parallel organized memory. An address shift register may be coupled to the parallel address output, and coupled to a serial increment circuit for incrementing an address stored in the address shift register. Further, the programmable logic circuit may include means for simultaneously shifting the address shift register and shifting a data shift register coupling the parallel data input and the serial data output such that serial data is output simultaneous with the address being incremented.

In another aspect of the present invention a method for programming the programmable logic circuit discussed hereinabove is disclosed. Corresponding techniques may be used in other aspects of the present invention. These include a method for reducing the amount of configuration information needed to configure a programmable logic circuit, and a single integrated circuit chip memory circuit including a decompression engine.

To summarize, the present invention has many advantages and features associated with it. The architecture disclosed resolves problems connected with the increasing size of the external storage device required to hold the configuration of a programmable logic circuit. By storing a compressed version of the programmable logic circuit's configuration, smaller, less expensive external configuration storage is necessary. Further, since less information must be transferred to the FPGA, less configuration time is required. The compression techniques employed herein are generalized data compression techniques that are well established and understood. This obviates the need for developing complex customized data compression techniques while still providing very effective data compression.

Further advantages include the elimination of a separate history buffer associated with the generalized data decompression engine, and the use of serial logic which reduces the silicon area needed for implementation. The reduced size circuit could be implemented, for example, in a long narrow unused space of a programmable, logic circuit chip floorplan. In summary, the principles of the present invention advance the art of programmable logic circuits by improving the configuration process therefor and provide enhanced functionality thereof.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

According to the principles of the present invention, a generalized data decompression engine is incorporated into an FPGA. This facilitates the receipt and decompression of a compressed configuration bit stream transferred to the FPGA for configuration thereof. As used herein, the term "generalized data decompression engine" refers to a data decompression engine using a general purpose lossless data decompression technique such as, for example, a Lempel-Ziv data decompression technique. The term "generalized data decompression engine" is used herein to exclude those data decompression techniques that use FPGA specific protocols in their compressed data stream. For example, an excluded technique would be one which reduces the size of the configuration bit stream by sending a list of logic cells having the same configuration and a single programming word therefor.

Figure 2:
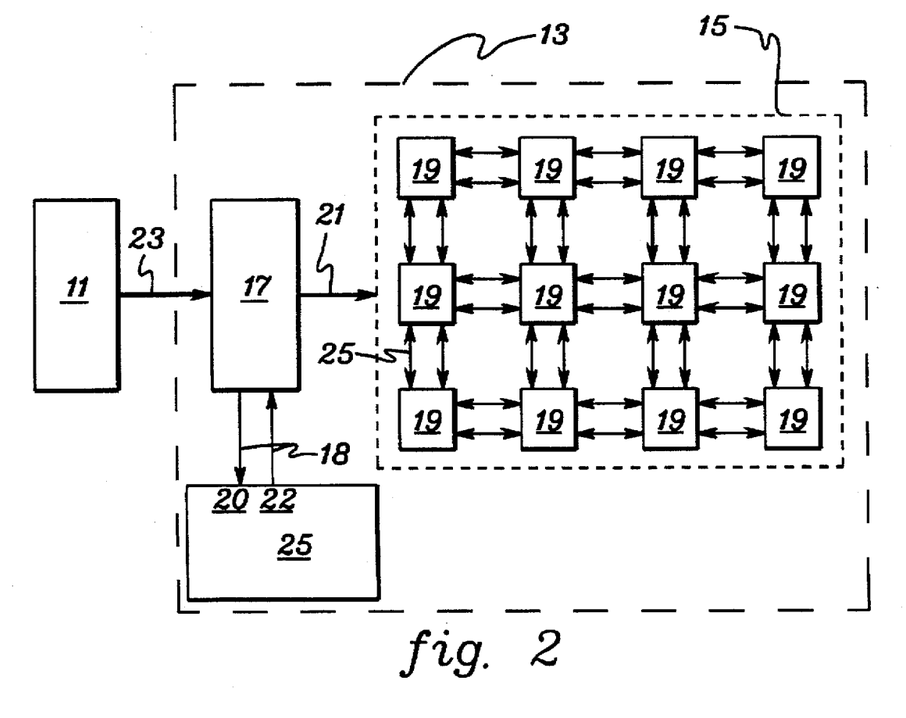
FIG. 2 is a diagram of an FPGA including a generalized data decompression engine for processing compressed configuration data pursuant to one embodiment of the present invention.

Shown in FIG. 2 is a diagram of FPGA 13 coupled to ROM 11. At system power-up/initialization, a state machine 17 within FPGA 13 reads a compressed configuration bit stream from ROM 11 that is disposed external to FPGA 13. As state machine 17 reads in the compressed configuration bit stream from ROM 11, it directs the bit stream to a compressed input 20 of generalized data decompression engine 25 over data paths 18. The generalized data decompression engine 25 decompresses the compressed configuration bit stream and returns a decompressed version of the configuration bit stream to state machine 17 via decompressed output 22. The decompressed configuration bit stream is then appropriately directed to the programming array of each logic cell 19 within the FPGA over data path 21. Once decompressed, the configuration bit stream is used to program the logic cells 19 by conventional techniques.

It will be understood by one of ordinary skill in the art that the compressed data can be stored in ROM 11 in various formats. As one example, all configuration data could be compressed. As another example, blocks of compressed data may be delimited by formatting and control sequences. One example of a formatted FPGA configuration may be found in, e.g., "Continuous Address Structure With Folding," Ser. No. 08/488,314, filed Jun. 7, 1995 and incorporated by reference herein in its entirety. Implementation of a state machine that processes the above-discussed formatting in connection with the techniques disclosed herein will be apparent to one of ordinary skill in the art.

Generalized data decompression engine 25 may comprise one of many types of generalized data decompression engines. These are commercially available as MACROs for user implementation within application specific integrated circuits ("ASICs"). Implementation of these MACROs within an ASIC design will be apparent to one of ordinary skill in the art. Specifically, along with each MACRO, the commercial supplier provides information regarding data inputs, data outputs, and clocking of the circuit described by the MACRO. This information is employed in conjunction with conventional IC design techniques for integration of the generalized data decompression engine into the FPGAs compressed configuration bit stream.

One example of a commercially available generalized data decompression engine is described in "ALDC-MACRO," document number DCALMASFU-01, by IBM corporation. This engine provides both data compression and data decompression using a Lempel-Ziv type technique and has been incorporated as a standard for use in compression of tape drive information (reference is made herein to "Adaptive Lossless Data Compression ("ALDC"), Quarter-Inch Cartridge Drive Standards, Inc., QIC-154, Mar. 10, 1994). In the embodiment of FIG. 2, as only data decompression is necessary, the data compression circuitry of the ALDC MACRO may be deleted to save silicon real estate on the FPGA.

The configuration bit stream must be initially compressed before storage in, for example, ROM 11 to facilitate later decompression within the FPGA. This is performed using a generalized data compression technique that is the complement of the generalized data decompression technique used within data decompression engine 25.

As an example, if data decompression engine 25 comprises the IBM ALDC-MACRO described above, a Lempel-Ziv type data compression technique corresponding to the Lempel-Ziv type data decompression technique of the MACRO is used to generate the compressed configuration.

Figure 7:
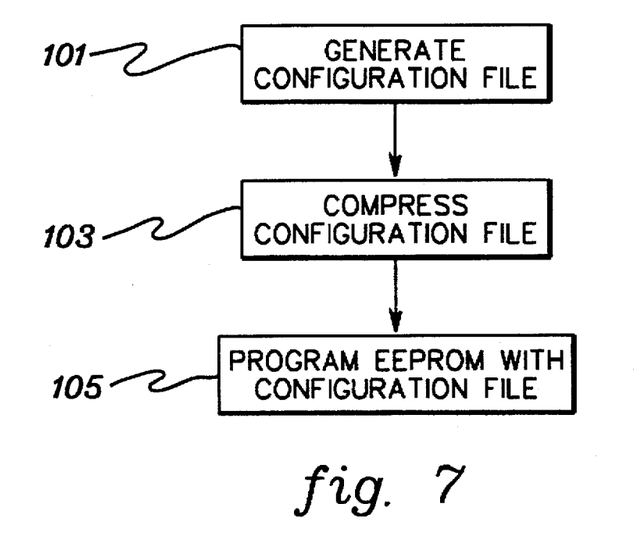
FIG. 7 is a flow diagram of a method for programming an EEPROM for use in programming an FPGA in conformance with one embodiment of the present invention.

The method for generating a compressed configuration bit stream begins with the conventional generation of an FPGA configuration file as shown in step 101 of FIG. 7. The configuration file is typically resident on a workstation that executes the FPGA design software. A software data compression technique is then applied to the configuration file to produce a compressed configuration file (step 103). As discussed above, the data compression technique used is a complement of the data decompression technique implemented by data decompression engine 25. Software versions of the hardware data compression/decompression MACROs are commercially available along with the accompanying macros. As an example, IBM provides a software version of the Lempel-Ziv type technique implemented in its ALDC-MACRO. Once the configuration file has been compressed, it may be downloaded into, for example, an Electrically Erasable Programmable Read Only Memory ("EEPROM") for use in operational programming of the FPGA (step 105). The EEPROM may comprise, for example, ROM 11 of FIG. 2.

Figure 8:
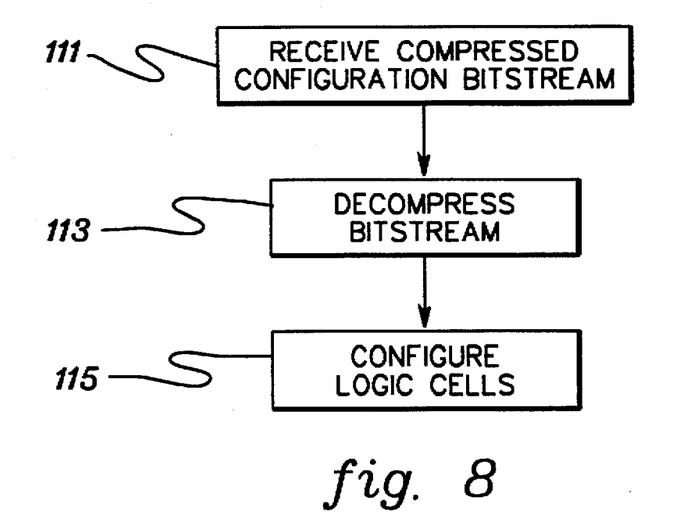
FIG. 8 is a flow diagram of a method for configuring an FPGA from a compressed configuration bit stream pursuant to an embodiment of the present invention.

The process for operational programming of an FPGA is summarized below with respect to the flow diagram of FIG. 8. The configuration bit stream is read into a configuration input of the FPGA from, for example, an EEPROM (step 111). As the compressed configuration bit stream is read in, it is directed through a data decompression engine as described hereinabove (step 113). As the decompressed configuration bit stream is output from the data decompression engine, it is used conventionally to program the logic cells of the FPGA (step 115).

By way of general discussion, various technologies are known to those skilled in the art to provide FPGA programmability. Any of these techniques, or variants thereof, can be used to program the programming array of the present invention. Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURN-AROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

A preferred approach for programming the logic cell and routing resources of the present invention involves SRAM memory cells, programmed by a user. The SRAM memory cells can be configured according to the techniques disclosed in the publication entitled "APPLICATION NOTE AT6000 SERIES CONFIGURATION", May 1993, Revision 1B, Atmel Corporation, which is hereby incorporated by reference herein in its entirety.

Many advantages and features are associated with the present invention. The FPGA architecture disclosed resolves problems connected with the increasing size of the external storage device required to hold the configuration of an FPGA. By storing a compressed version of the FPGAs configuration, less external configuration storage is necessary. Further, since less information must be transferred to the FPGA, less configuration time is required. The data compression techniques employed herein are generalized data compression techniques that are well established and understood. This obviates the need for developing complex FPGA specific data compression techniques while still providing very effective data compression. As a further advantage, the data decompression engine used in configuration of the FPGA can be reconfigured for use as an operational resource in the FPGA. In summary, the principles of the present invention improve the configuration process for FPGAs and further provide enhanced functionality therefor.

Described below are further embodiments of the present invention that enhance the embodiments described hereinabove. These enhancements are described in particular regard to the IBM-ALDC MACRO and associated Lempel-Ziv type data compression/decompression techniques, but are equally applicable to other generalized data compression/decompression engines and techniques. Reference is made herein to "A universal algorithm for sequential data compression," J. Ziv and A. Lempel, IEEE Trans. Inform. Theory, vol. IT-23, no. 3, pp. 337–343, 1977 and "Adaptive Lossless Data Compression (ALDC)," QIC Development Standard, QIC-154, Revision A, 10 Mar. 1994, both of which are hereby incorporated herein in their entirety.

More specifically, three enhancements to the above described embodiments comprise: (1) avoiding the use of the separate history buffer conventionally associated with the ALDC macro by arranging to copy from FPGA destination memory portions loaded earlier; (2) the use of serial logic circuits, especially in cases where the source of the compressed configuration data supplies its data in serial form; and (3) the use of a parallel-to-serial converter to allow a variety of parallel input data formats to be processed by the serial circuitry.

These three enhancements facilitate an extremely small generalized data decompression engine thus saving silicon real estate on the FPGA. Significant compression of FPGA configuration data is achieved from the ALDC algorithm, so a smaller and cheaper non-volatile memory chip may be used to hold the configuration data.

Elimination of a Separate History Buffer

ALDC data decompression engines conventionally include a history buffer which maintains a recent history of data processed by the decompression engine. The history buffer comprises, for example, 512 bytes and occupies a corresponding amount of silicon real estate on the FPGA. Unfortunately, this decreases the amount of silicon real estate available for programmable logic. It is therefore advantageous to eliminate the dedicated, separate, history buffer.

By way of background, ALDC encoded (compressed) data consists of a mixture of LITERALS and COPY_POINTERS, the latter being encoded when a string of incoming data bytes has occurred earlier and thus matches some part of the history buffer's contents. COPY_POINTERS have two elements, the length of the matching string, and where in the history it is located. If the incoming data byte does NOT form a part of a matching string, it is encoded as a LITERAL, which contains only a single byte of data. A single bit of information is used in ALDC to distinguish between LITERALS and COPY_POINTERS. The single bit being zero indicates a LITERAL, and is followed by the eight data bits of the byte. The single bit being one indicates a COPY_POINTER, and this will be followed by string length count and history location fields. In ALDC, the length field is itself of variable size, and can require from two through twelve bits, depending on the value encoded. The history location field is a fixed number of bits, depending upon the history buffer size used. It is typically nine, ten or eleven bits in size.

The circuitry required to decode an ALDC compressed bit stream without the use of a separate history buffer is described in detail below with respect to FIGS. 3 and 4.

Figure 3:
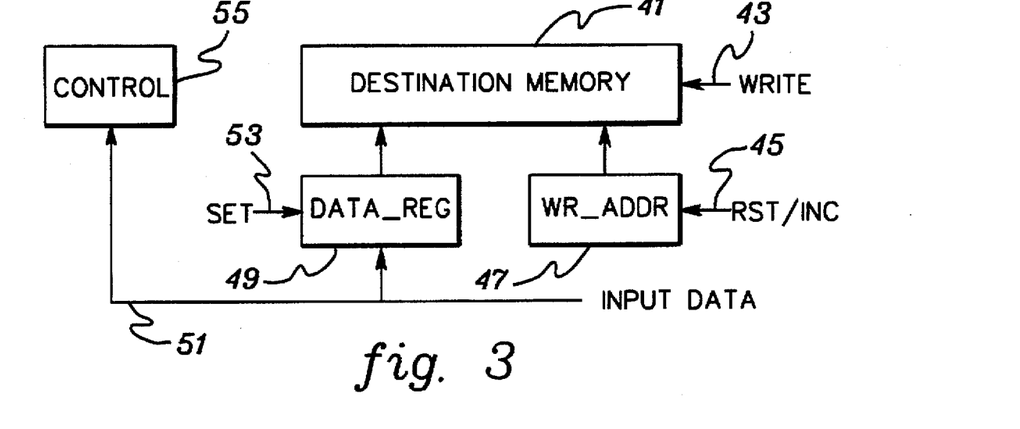
FIG. 3 is a diagram of the components of the generalized data decompression engine used to decode literal data sequences in accordance with one embodiment of the present invention.

With respect to FIG. 3, to decode LITERALS, a hardware decoder contains a data register 49 ("DATA_REG"), and incrementable write address register 47 ("WR_ADDR"). Interconnect busses 51 couple the elements of FIG. 3. Operationally, control circuitry 55 resets 45 ("RST") WR_ADDR 47 at the start of the operation, detects a first zero signifying the front of the LITERAL and then asserts a SET control 53 to load DATA_REG 49 with the subsequent eight data bits. After that, a WRITE control 43 is asserted to a destination memory 41 such that the information in DATA_REG 49 is written to the memory location address stored in WR_ADDR 47. Lastly, an increment ("INC") 45 is issued to WR_ADDR, thus updating its value such that the circuitry is ready to process the next LITERAL. Destination memory 41 comprises the configuration memory of the FPGA logic cells which is well known to facilitate read and write access using conventional address/data access schemes. (The connections between control circuitry 55, SET control 53, RST/INC control 45 and WRITE control 43 are not explicitly shown to simply FIG. 3).

In order to process COPY_POINTERS, it is necessary for the decompressor to be able to reference the most recently processed data. This data is conventionally held in a separate history buffer which occupies IC chip real estate as discussed above. However, in the present embodiment, the separate history buffer has been eliminated. To provide the history buffer function, the destination configuration memory (e.g., SRAM) of the FPGA is used both as a configuration memory and as a history buffer. According to the techniques disclosed herein, repeated data strings are read from their location in a previously loaded area of the configuration memory and are then copied to the current area of the configuration memory.

The hardware resources used to process COPY_POINTERS without the use of a separate history buffer are described hereinbelow with regard to FIG. 4. Beyond the resources discussed above with respect to FIG. 3, additional resources include a read address register ("RD_ADDR") 61. As discussed in further detail hereinbelow, RD_ADDR 61 is loaded via an arithmetic logic unit ("ALU") 65, which subtracts a history offset from the current WR_ADDR 47 value. A COUNT register 57 is used to track the number of bytes (or words for other than byte based implementations) copied in response to a COPY_POINTER.

To process a COPY_POINTER, the control circuitry must detect the "1" designating the beginning of the COPY_POINTER, then parse and decode the variable size string length field which follows into COUNT 57. Such parsing and decoding are performed in conventional ALDC processing. Thereafter, WR_ADDR 47 is directed to an input 66 of ALU 65, together with a history offset decoded from the input data which is presented to an input 68. RD_ADDR 61 is then loaded via SET control 63 with the difference between WR_ADDR and the history offset as calculated by asserting a SUBTRACT 67 control signal to ALU 65.

After the initial register loading described above, control circuitry 55 executes a string copy operation, consisting of the following sequence. A byte of data is read (i.e., a read ("RD") signal is asserted on control line 69) from destination memory 41 to DATA_REG 49 from an address designated by RD_ADDR 61. Then a write (i.e., a write ("WR") signal is asserted on control line 69) to destination memory 41 with the contents of DATA-REG 49 is performed using the address in WR_ADDR 47.

The copy process continues with RD_ADDR 61 and WR_ADDR 45 being incremented via "INC" control signals 63 and 45, respectively. COUNT 57 is decremented via DEC control signal 59. Thereafter, a copy is performed for the new values of RD_ADDR 61 and WR_ADDR 45. This process is repeated until decrementing COUNT 57 gives a result of zero, at which point COPY_POINTER processing is complete. (The connections between control circuitry 55, SET control 53, RST/INC control 45, WR/RD control 69, SET/INC control 63, SET/DEC control 59 and SUBTRACT control 67 are not explicitly shown to clarify FIG. 4.)

Due to the elimination of the separate history buffer, a modification is also made to the calculation of the history offset when the data is originally compressed. As defined in ALDC, a history location field is the absolute start address in the history buffer of the matching string. In the present invention, the history location comprises a history offset that will be subtracted from the current WR_ADDR value to obtain the RD_ADDR value.

Figure 4:
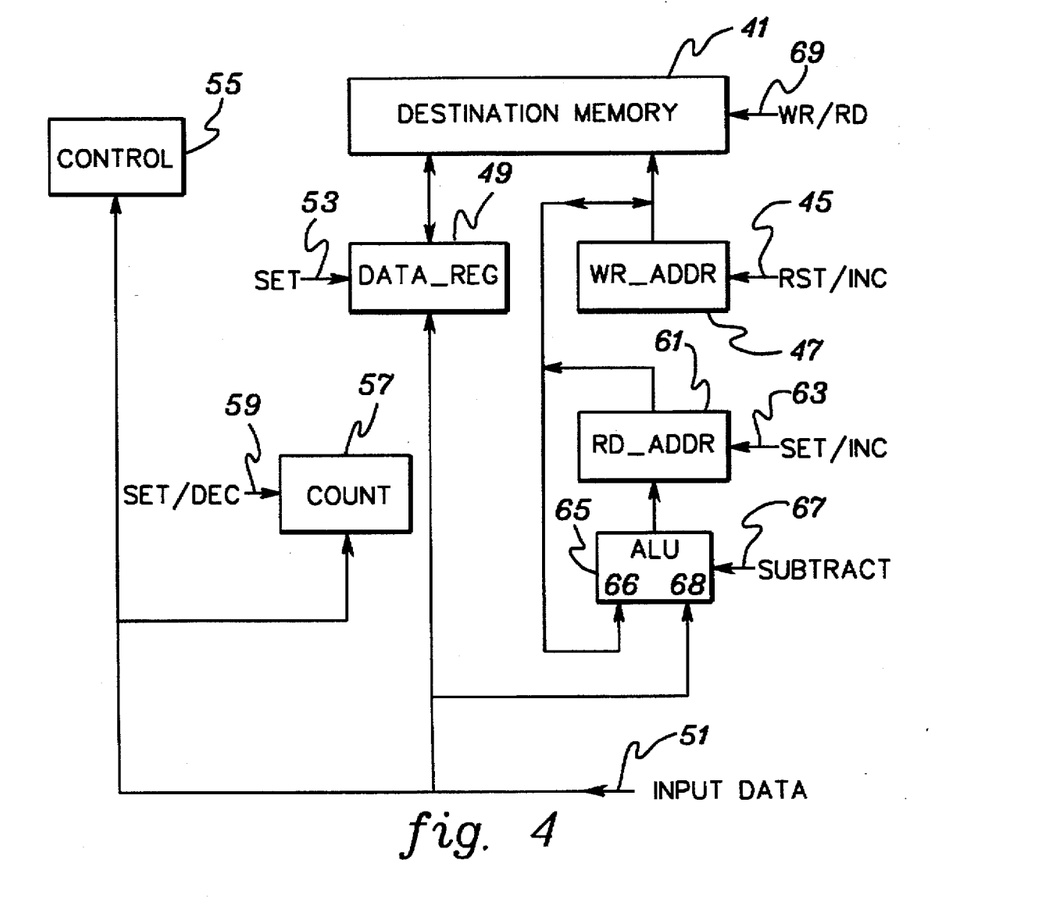
FIG. 4 is a diagram of the components of the generalized data decompression engine used to decode copy pointers without the use of a separate history buffer in conformance with an embodiment of the present invention.

The circuitry of FIGS. 3 and 4 comprise an ALDC decoder that does not require a separate history buffer. Further, because the FPGA configuration memory functions as the conventional history buffer, the effective size of the history buffer has been increased to the total size of the FPGA configuration memory. Accordingly, higher compression ratios associated with larger history buffers may be obtained.

Use of Serial Logic Circuits

If the data being fed to the generalized data decompression engine is in serial form, and if extreme speeds are not required, the use of serial processing logic together with the restructuring of some of the encoded input data fields can result in further circuit and silicon real estate savings. In an FPGA application, extreme speeds are typically not required since the access times associated with the non-volatile ("NV") storage devices used to load the FPGAs are typically slower than the serial circuitry described hereinbelow. Further, the minor data field restructuring is easily performed in software as the compressed configuration data is prepared for transfer into an NV storage device.

Adapting the circuitry of FIGS. 3 and 4 to process LITERALS may be implemented using conventional shift registers to implement WR_ADDR 47 and DATA_REG 49. However, processing COPY POINTERS is more complex. Shown in FIG. 5 and described hereinbelow is serial processing logic that may be used in combination with the circuits of FIGS. 3 and 4 to provide serial processing of COPY_POINTERS.

Figure 5:
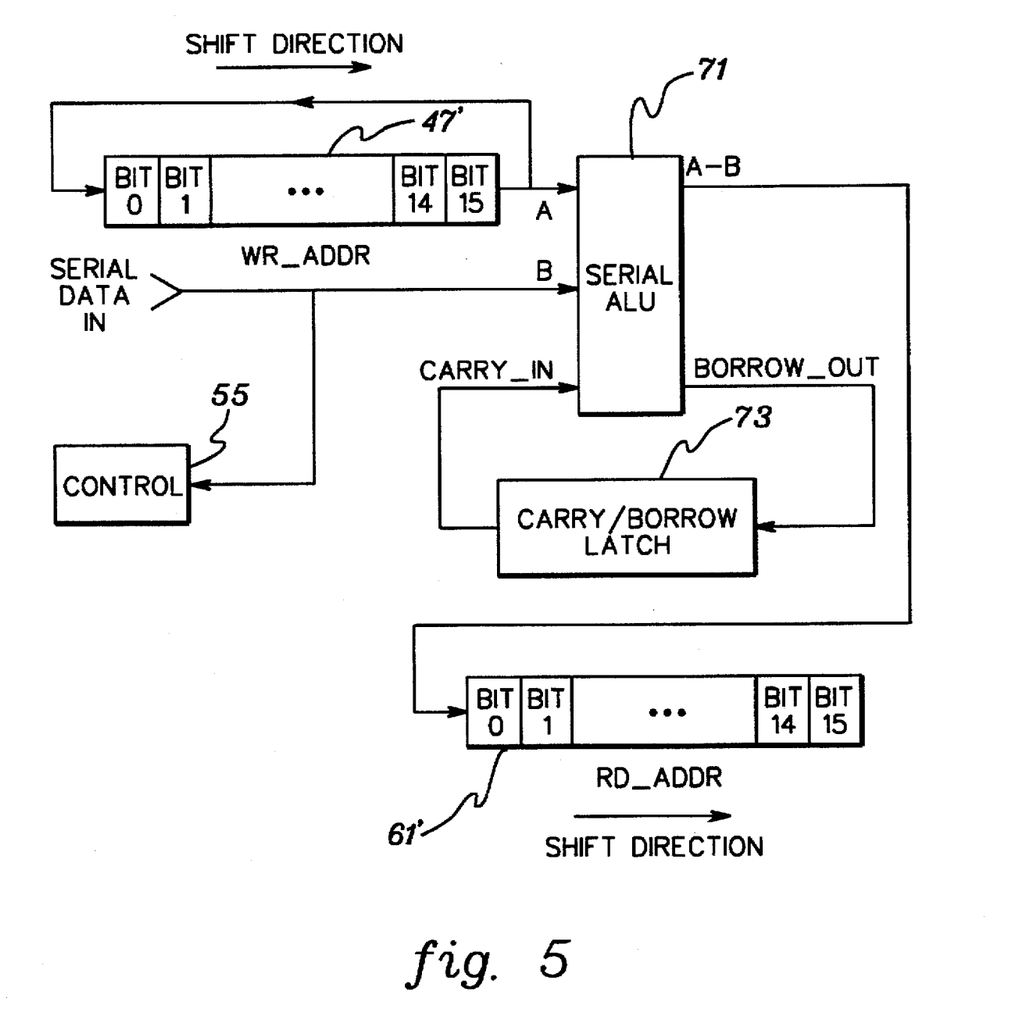
FIG. 5 is a diagram of the components of the generalized data decompression engine in a serial processing embodiment of the present invention.

In the serial processing embodiment, WR_ADDR register 47' and RD_ADDR register 61' will comprise shift registers. (WR_ADDR register 47' and RD_ADDR register 61' are serial versions of WR_ADDR register 47 and RD_ADDR register 61, respectively.) The ALU is implemented as a single bit wide serial ALU 71. Serial ALU 71 has two single bit inputs, A and B, and a carry/borrow input CARRY_IN. It has two single bit outputs, namely the difference output A-B (i.e., A minus B) and the borrow output, which is fed into a single bit carry/borrow latch 73, used to feed back into CARRY_IN during a next shift cycle.

The truth table for serial ALU 71 is shown below.

| INPUTS | | | OUTPUTS | |
|---|---|---|---|---|
| A | B | CARRY_IN | A-B | BORROW_OUT |
| 0 | 0 | 0 | 0 | 0 |
| 0 | 1 | 0 | 1 | 1 |

-continued

| INPUTS | | | OUTPUTS | |
|---|---|---|---|---|
| 1 | 0 | 0 | 1 | 0 |
| 1 | 1 | 0 | 0 | 0 |
| 0 | 0 | 1 | 1 | 1 |
| 0 | 1 | 1 | 0 | 1 |
| 1 | 0 | 1 | 0 | 0 |
| 1 | 1 | 1 | 1 | 1 |

Operationally, 16 shift cycles are required to complete loading of 16 bit wide RD_ADDR register 61'. In more specific regard to the loading of RD_ADDR 61', the serial input data field comprising the history offset is read in one bit at a time, beginning with the low order bit and presented to ALU 71 input B. Simultaneously, at each shift cycle, the data value from WR_ADDR register 47' is rotated right and presented to ALU 71 input A. An output A–B from the ALU is shifted RIGHT into RD_ADDR register 61'. Specifically, at each shift cycle, the difference between ALU inputs A and B is shifted right into RD_ADDR register 61'.

Advantageously, assuming that true and complement data are available from all shift register latches, only eight logic gate circuits are required to implement serial ALU 71. This logic gate count required for such a serial ALU 71 is less than a parallel logic implementation would require. Similarly, the increment and decrement functions for WR_ADDR, RD_ADDR and COUNT, take extremely few logic gates if implemented serially (e.g., IP_ADDR of FIG. 6 described below). As a performance example, using a 20 nanosecond shift clock cycle, it is feasible to output decoded data at speeds of 5 Mbytes/second. In an FPGA application, the configuration load of a 64 kilobyte configuration store (i.e., destination memory 41) would take 13 milliseconds. Faster gate technology would increase the speed of the serial logic and permit even faster load times.

Similar serial processing techniques as discussed above may be used to further reduce the size of required circuitry. As an example, the circuitry required to parse the matching string length fields to load the COUNT register may be processed serially (i.e., prior to processing a COPY_POINTER).

Use of a Parallel to Serial Converter

Figure 6:
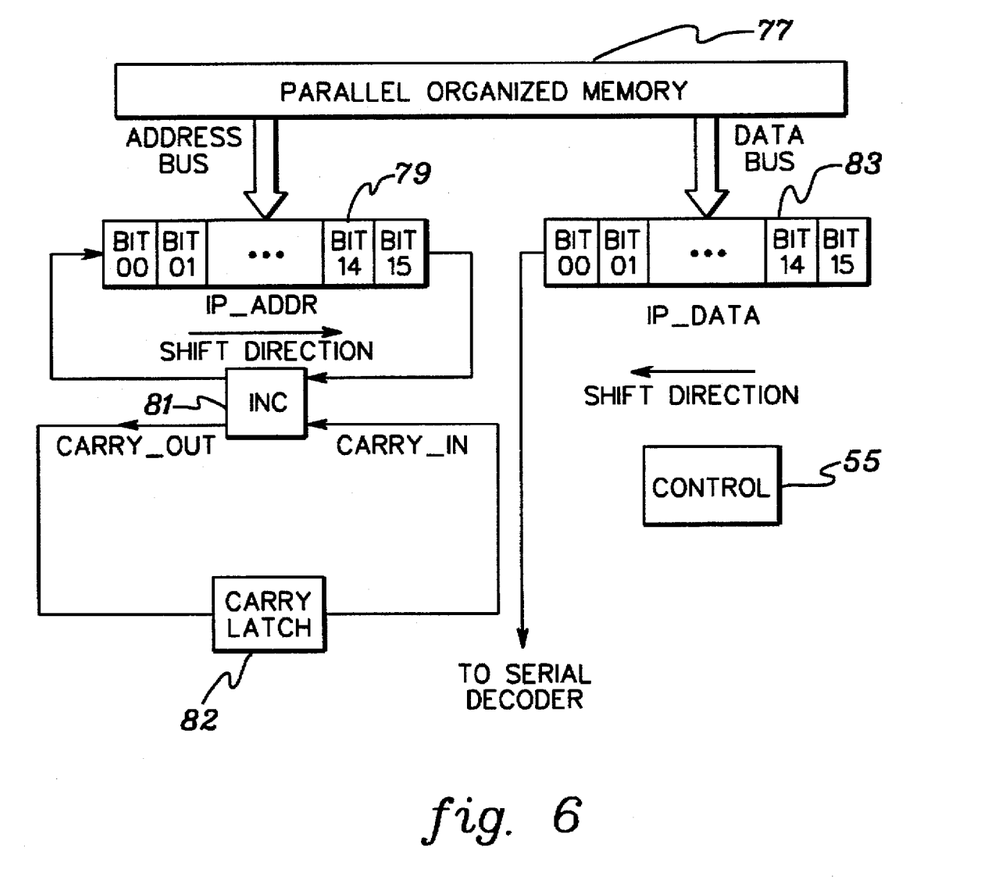
FIG. 6 is a diagram of the components of a parallel to serial converter used to address and serially read data from an external memory using serial processing logic pursuant to an embodiment of the present invention.

If a serial decoder circuit is employed as outlined above, the circuitry is adapted to accommodate many parallel organizations of NV storage devices and to provide serialized data therefrom to the serial decoder circuitry discussed hereinabove. With reference to FIG. 6, additional resources include a parallel data shift register ("IP_DATA") 83 to provide a parallel data input and to accept the data words from an external parallel organized memory 77. Further, an incrementable address register ("IP_ADDR") 79 provides a parallel address output to supply the read address. IP_ADDR 79 comprises a shift register that is connected to associated serial incrementer circuitry ("INC") 81 that is used to perform a serial increment function. As one example, INC 81 may comprise a 1 bit adder having its carry out looped back to its carry in through a one bit carry latch 82. Before an increment of IP_ADDR 79, the carry latch is set, and then IP_ADDR 79 is shifted 16 times because it is a 16 bit register. As a result, IP_ADDR 79 is incremented by one.

To facilitate the supply of serial data to the generalized data decompressor, IP_DATA 83 is arranged to be shifted LEFT to supply data to the serial decoder circuitry discussed hereinabove. The shifting of IP_DATA 83 can be performed simultaneously with the shifting of IP_ADDR 79 such that the increment function does not occupy any extra clock cycles. Control circuitry 55 supplies the control signals required to perform the above discussed functions (connections thereto are not explicitly shown to simplify FIG. 6).

A variety of different parallel input word widths are accommodated by connecting the data word from memory 77 to appropriate IP_DATA bits. For example, to accommodate a 4-bit wide parallel memory organization, memory 77 is connected to IP_DATA bits 00 through 03, and 4 shifts are applied to IP_DATA after every read from the parallel memory. If an 8-bit parallel memory is used, it is connected to IP_DATA bits 00 through 07, 8 shifts being applied after every read. A 12-bit organization uses bits 00 through 11, and a 16-bit organization uses all bits. The proper number of shifts (e.g., 16) are however still required to increment IP_ADDR 79.

Figure 9:
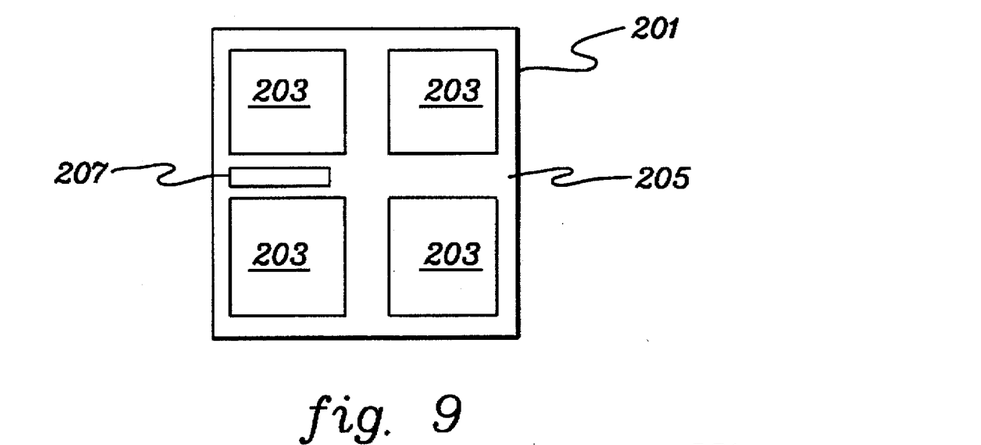
FIG. 9 is a floorplan of an FPGA having a generalized data decompression engine therewithin pursuant to one embodiment of the present invention.

The reduced size of the data decompression circuitry enables its fabrication in certain less frequently used regions of FPGA IC floor plans. For example, in regard to FIG. 9, an FPGA 201 may be fabricated with a cruciform floor plan that includes elongated regions of available space 205 separating groups of logic cells 203. The serial decompression logic of the present invention may be "stretched out" into a long narrow shape 207 and placed within the available elongated regions 205 of FPGA 201. Thus, the data decompression circuitry disclosed herein may occupy otherwise unused portions of the FPGA floor plan.

The generalized data decompression engine disclosed herein may be located in the NV storage device used to configure an FPGA rather than in the FPGA itself. In such a case, a conventional FPGA accepts, for example, an uncompressed serial configuration bitstream from the NV storage device containing the generalized data decompression engine of the present invention. The storage array of the NV storage device contains the compressed configuration data. Advantageously, a smaller and less expensive NV storage device can therefore be used to emulate a larger device.

Figure 10:
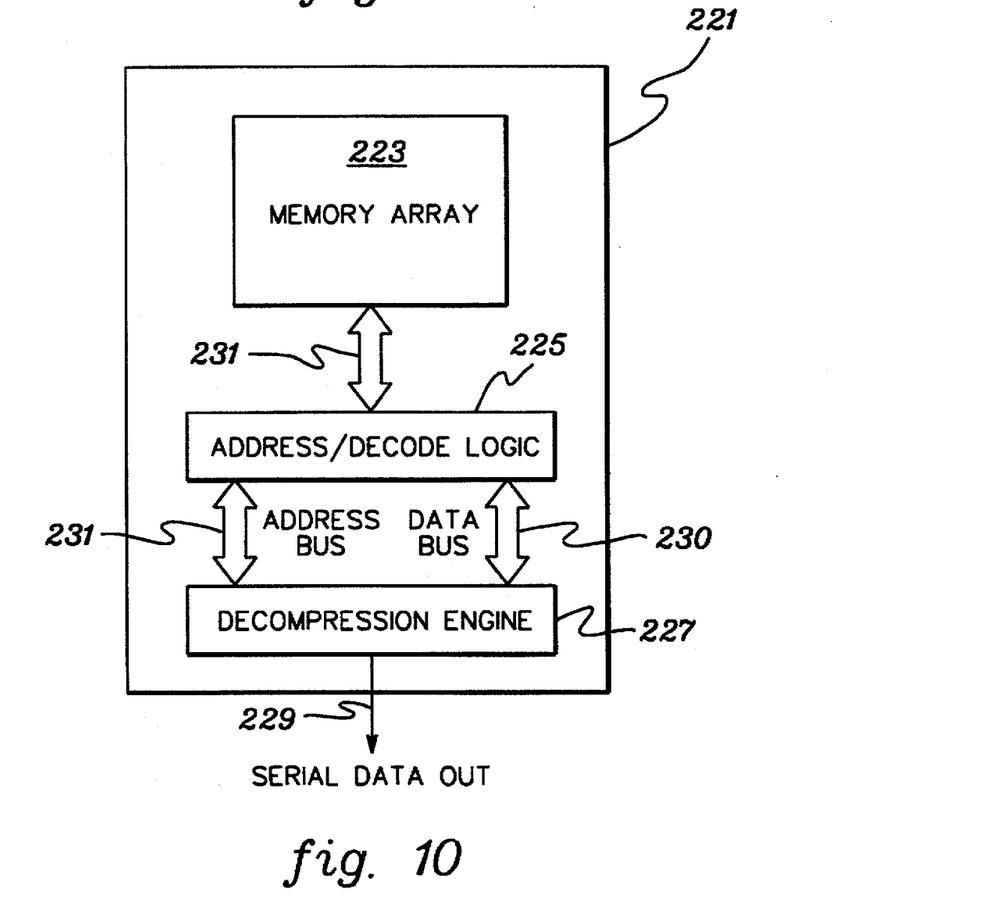
FIGS. 10-11 are diagrams of a non-volatile memory integrated circuit having a generalized data decompression engine therewithin according to embodiments of the present invention.

In FIG. 10, an NV storage device 221 is shown. NV Storage device 221 includes an NV memory array 223 comprising, for example, an array of EEPROM cells. Conventional address/decode logic 225 is coupled to NV memory array 223 via interconnects 231. A generalized data decompression engine 227 comprising, for example, the ALDC MACRO is coupled to the memory through a standard address bus 231 and data bus 230. Counter circuitry and associated control logic is added to the generalized data decompression engine 227 such that it may sequentially read the contents of memory array 223, decompress it, and output a decompressed bit stream on a serial output line 229. NV storage device 221 may be used to program FPGAs, or to provide an decompressed serial bit stream output for any application requiring one. Thus, a larger amount of data can be stored in, and retrieved from, a lower capacity memory device.

Figure 11:
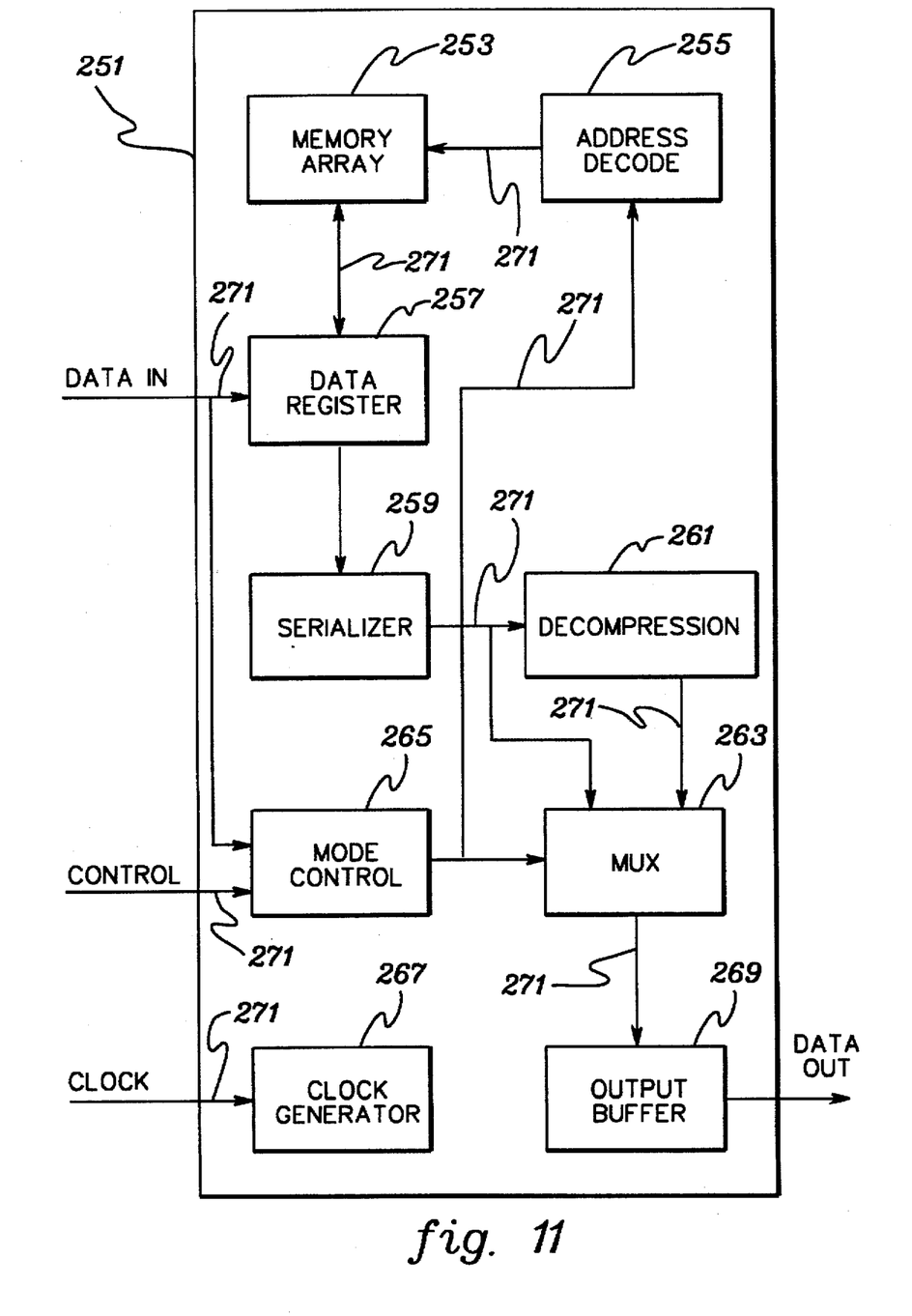

In FIG. 11 is another embodiment of a NV storage device 251. The elements of NV storage device 251 are described below:

| | |
|---|---|
| MEMORY ARRAY (253) | NV Parallel Array of power of two size Typical sizes are 4K × 8 8K × 8 16K × 8 etc. |
| DATA REGISTER (257) | Latches input data onto device and latches output data from MEMORY ARRAY |
| SERIALIZER (259) | Converts parallel data to serial for output or compression |
| MODE CONTROL (265) | Sets mode of the device Valid modes are WRITE READ/Non-Compression READ/Compression Sets Count-Up or Count-Down |
| CLOCK GENERATOR (267) | Generates device Clocks from single external source |
| ADDRESS DECODE (255) | Generates X/Y Addressing for MEMORY ARRAY Ability to Count-Up or County-Down depending on Mode |
| DECOMPRESSION (261) | Serial Compression is used to save space |
| MUX (263) | Arbitrates between Compressed and Non-Compressed output |
| OUTPUT BUFFER (269) | Drives data out |

Each of the element of NV storage device 251 are interconnected by bussing 271.

To summarize, the three enhancements discussed above provide a significant advantage to the FPGA class of product. The elimination of a separate history buffer, together with the use of serial logic, substantially reduces the silicon area needed for ALDC hardware decoder implementation. The reduced size circuit could be implemented, for example, in the unused space in the cruciform layout of an FPGA chip floorplan. The compression obtainable on FPGA configuration data offers significant advantages over the existing FPGA products on the market, as smaller/cheaper NVRAMs can be used with FPGAs having the features disclosed herein. Additionally, a proposed parallel to serial converter allows the serial circuitry to be used with a wide variety of parallel input data organizations, at a minimal silicon area cost.

While the invention has been described in detail herein in accordance with certain preferred embodiments thereof, many modifications and changes therein may be effected by those skilled in the art. Accordingly, it is intended by the following claims to cover all such modifications and changes as fall within the true spirit and scope of the invention.

What is claimed is:

1. A programmable logic circuit comprising:

a plurality of programmable logic resources;

a configuration input; and a generalized data decompression engine having a compressed input and a decompressed output, said compressed input being coupled to said configuration input and said decompressed output being coupled to said plurality of programmable logic resources to provide programming thereof, wherein said generalized data decompression engine comprises a Lempel-Ziv decompression engine.

2. The circuit of claim 1, wherein said generalized data decompression engine comprises and ALDC decompression engine.

3. A programmable logic circuit comprising:

a plurality of programmable logic resources;

a configuration input;

a generalized data decompression engine having a compressed input and a decompression output, said compressed input being coupled to said configuration input and said decompressed output providing direct run-time personalization of said plurality of programmable logic resources; and a configuration memory for said direct run-time personalization of said plurality of programmable logic resources said configuration memory also comprising a history buffer of said generalized data decompression engine.

4. The circuit of claim 3, wherein said generalized data decompression engine comprises a Lempel-Ziv decompression engine.

5. The circuit of claim 3, wherein said generalized data decompression engine further comprises means for copying data from an already loaded portion of said configuration memory to another portion of said configuration memory.

6. The circuit of claim 5, wherein said means for copying comprises a read address register for storing an address of said configuration memory from which data is to be copied.

7. The circuit of claim 6, further comprising a write address register for storing an address of said configuration memory to which data is to be written.

8. The circuit of claim 7, further comprising an arithmetic logic unit ("ALU") having two inputs, a first input of said two inputs being coupled to said write address register, a second input of said two inputs being coupled to the compressed input of said generalized data decompression engine, an output of said arithmetic logic unit being coupled to said read address register for storing therein an address as an arithmetic function of said first input and said second input.

9. The circuit of claim 8, wherein said read address register and said write address register comprise shift registers.

10. The circuit of claim 9, wherein said ALU comprises a one bit serial ALU wherein said first input, said second input, and said output are each one bit wide.

11. The circuit of claim 10, wherein said arithmetic function comprises a subtraction of said second input from said first input.

12. The circuit of claim 11, wherein said ALU further comprises a borrow out and a carry in, said borrow out coupled to said carry in by a one bit carry/borrow latch.

13. The circuit of claim 7, further comprising a count register for storing a number of words of data to be copied by said means for copying.

14. The circuit of claim 13, further comprising means for incrementing the read register, incrementing the write register and decrementing the count register for each word of data copied of said number of words of data to be copied.

15. The circuit of claim 14, further comprising means for terminating copying upon said count register holding a value of zero.

16. A programmable logic circuit comprising:

a plurality of programmable logic resources;

a configuration input;

a generalized data decompression engine having a compressed input and a decompressed output, said compressed input being coupled to said configuration input and said decompressed output being coupled to said plurality of programmable logic resources to provide programming thereof, wherein said generalized data decompression engine comprises serial processing logic and wherein said compressed input of said generalized data decompression engine comprises a serial data input; and a parallel to serial converter including a parallel address output, a parallel data input and a serial data output, said serial data output being coupled to said serial data input of said generalized data decompression engine, said parallel address output and said parallel data input adapted to couple to a parallel organized memory.

17. The circuit of claim 16, wherein said generalized data decompression engine comprises a Lempel-Ziv decompression engine.

18. The circuit of claim 16, further comprising an address shift register coupled to said parallel address output and a serial increment circuit for incrementing an address stored in said address shift register.

19. The circuit of claim 18, further comprising means for simultaneously shifting said address shift register and shifting a data shift register coupling said parallel data input and said serial data output such that serial data is output simultaneous with said address being incremented.

20. A programmable logic circuit comprising:

a plurality of programmable logic resources;

a configuration input; and a generalized data decompression engine having a compressed input and a decompressed output, said compressed input being coupled to said configuration input and said decompressed output being coupled to said plurality of programmable logic resources to provide programming thereof, wherein said circuit comprises an integrated circuit chip having a floorplan, said floorplan having an elongated region separating groups of said plurality of programmable logic resources, said generalized data decompression engine being within said elongated region.

21. The circuit of claim 20, wherein said generalized data decompression engine comprises a Lempel-Ziv decompression engine.

22. A method for programming a programmable logic circuit comprising a plurality of programmable logic resources, said method comprising the steps of:

(a) receiving a compressed configuration;

(b) decompressing said compressed configuration using a generalized data decompression technique to produce a decompressed configuration; and (c) programming said plurality of logic resources using said decompressed configuration, wherein said decompressing step (b) comprises decompressing said configuration using a Lempel-Ziv decompression technique.

23. The method of claim 22, wherein said decompressing step (b) comprises decompressing said configuration using an ALDC decompression technique.

24. A method for programming a programmable logic circuit comprising a plurality of programmable logic resources, said method comprising the steps of:

(a) receiving a compressed configuration;

(b) decompressing said compressed configuration using a generalized data decompression technique to produce a decompressed configuration; and (c) programming said plurality of logic resources using said decompressed configuration, wherein said programmable logic circuit further comprises a configuration memory for direct run-time personalization of said plurality of programmable logic resources, said method further including accessing said configuration memory as a history buffer during said decompressing step (b).

25. The method of claim 24, wherein said decompressing step (b) comprises decompressing said configuration using a Lempel-Ziv decompression technique.

26. The method of claim 24, further comprising copying data from an already loaded portion of said configuration memory to another portion of said configuration memory.

27. The method of claim 26, wherein said programmable logic circuit further comprises a read address register, said method further comprising storing an address of said configuration memory from which data is to be copied from in said read address register.

28. The method of claim 27, wherein said programmable logic circuit further comprises a write address register, said method further comprising storing an address of said configuration memory to which data is to be written in said write address register.

29. The method of claim 28, wherein said programmable logic circuit further comprises an arithmetic logic unit ("ALU") said method further including subtracting a history offset from a value within said write address register using said ALU, and storing a result in said read address register.

30. The method of claim 29, wherein said arithmetic logic unit comprises a one bit serial arithmetic logic unit such that said subtracting comprises subtracting using serial processing.

31. The method of claim 30, wherein said arithmetic logic unit further comprises a borrow out and a carry in, said method further comprising passing said borrow out to said carry in during said subtracting using serial processing.

32. The method of claim 28, wherein said programmable logic circuit further comprises a count register, said method further comprising storing a number of words of data to be copied in said count register.

33. The method of claim 32, further comprising incrementing the read register, incrementing the write register and decrementing the count register for each word of data copied of said number of words of data to be copied.

34. The method of claim 33, further comprising terminating said copying upon said count register holding a value of zero.

35. A method for programming a programmable logic circuit comprising a plurality of programmable logic resources said method comprising the steps of:

(a) receiving a compressed configuration;

(b) decompressing said compressed configuration using a generalized data decompression technique to produce a decompressed configuration; and (c) programming said plurality of logic resources using said decompressed configuration, wherein said compressed configuration comprises a serial bit stream, said programmable logic circuit further comprising a parallel to serial converter including a parallel address output, a parallel data input and a serial data output for generating said serial bit stream, said parallel address ouptut and said parallel data input adapted to couple to a parallel organized memory, said method further including serializing said parallel data input to produce said serial bit stream.

36. The method of claim 35, wherein said decompressing step (b) comprises decompressing said configuration using a Lempel-Ziv decompression technique.

37. The method of claim 35, further comprising incrementing an address of said parallel address output by shifting said address through serial incrementer logic.

38. The method of claim 37, further comprising simultaneously shifting said address and shifting a data value of said parallel data input such that serial data is output simultaneous with said address being incremented.

39. A method for reducing the amount of configuration information needed to configure a programmable logic circuit comprising the steps of:

(a) compressing a configuration for the programmable logic circuit using a generalized compression technique to produce a compressed configuration; and (b) transferring said compressed configuration to a configuration storage device that facilitates loading of the programmable logic circuit, wherein said compressing step (a) comprises compressing said configuration with a Lempel-Ziv compression technique.

* * * * *

UNITED STATES PATENT AND TRADEMARK OFFICE
CERTIFICATE OF CORRECTION

PATENT NO. : 5,745,734
DATED : April 28, 1998
INVENTOR(S) : Craft et al.

It is certified that error appears in the above-identified patent and that said Letters Patent is hereby corrected as shown below:

Claim 2, Column 12, Line 66     "and" should read —an—

Claim 3, Column 13, Line 6     "decompression" should read —decompressed—

Signed and Sealed this

Eighth Day of December, 1998

*Attest:*

BRUCE LEHMAN

*Attesting Officer*     *Commissioner of Patents and Trademarks*